United States Patent [19]

Koch

[11] Patent Number: 5,737,570

[45] Date of Patent: Apr. 7, 1998

[54] MEMORY UNIT INCLUDING AN ADDRESS GENERATOR

[75] Inventor: Werner Koch, Hemmingen, Germany

[73] Assignee: Alcatal N.V., Amsterdam, Netherlands

[21] Appl. No.: 847,907

[22] Filed: Apr. 28, 1997

Related U.S. Application Data

[63] Continuation of Ser. No. 452,669, May 26, 1995, abandoned, which is a continuation of Ser. No. 930,924, Aug. 18, 1992, abandoned.

[30] Foreign Application Priority Data

Aug. 21, 1991 [DE] Germany ............... 41 27 579.9

[51] Int. Cl.$^6$ ................................. G06F 12/00
[52] U.S. Cl. ................. 395/476; 395/421.08; 395/896; 395/200.07
[58] Field of Search ............... 395/200.07, 846, 395/872, 476, 421.08, 421.07; 370/94.1, 60, 92, 93

[56] References Cited

U.S. PATENT DOCUMENTS

| 4,482,951 | 11/1984 | Swaney et al. ............ 395/843 |
| 4,658,349 | 4/1987 | Tabata et al. ............ 395/846 |
| 4,723,223 | 2/1988 | Hanada ............ 395/846 |
| 5,003,509 | 3/1991 | Bosnyak ............ 365/230.05 |
| 5,195,088 | 3/1993 | Urbansky ............ 370/545 |

FOREIGN PATENT DOCUMENTS

| 37 13 111 | 11/1987 | Germany . |
| 2 056 134 | 3/1981 | United Kingdom . |
| 2 095 441 | 9/1982 | United Kingdom . |

*Primary Examiner*—Eddie P. Chan
*Assistant Examiner*—Reginald G. Bragdon
*Attorney, Agent, or Firm*—Spencer & Frank

[57] ABSTRACT

A memory unit includes a plurality of address ranges whose size and number are freely variable. For each address range, one address value is stored, as well as a start and an end address. The memory unit has an address generator which counts through the addresses from the start address to the end address. The start address and the end address are stored in an address register. By way of a code, the start and end addresses are called up in the address register and a current address value is called up in the address generator. The address generator counts through the address range until it reaches the end address.

12 Claims, 3 Drawing Sheets

1

MEMORY UNIT INCLUDING AN ADDRESS GENERATOR

This application is a continuation of application Ser. No. 08/452,669, filed May 26, 1995 (now abandoned), which was a continuation of application Ser. No. 07/930,924, filed Aug. 18, 1992 (now abandoned).

CROSS REFERENCE TO RELATED APPLICATION

This application claims the priority of application Ser. No. P 41 27 579.9, filed Aug. 21, 1991, in the Federal Republic of Germany, the subject matter of which is incorporated herein by reference.

BACKGROUND OF THE INVENTION

1. Field of the Invention

The present invention relates to a memory unit including an address generator for the successive generation of address ranges delineated by start and end addresses, such that at least parts of a data stream are successively written into and/or read out of a memory.

2. Background Information

Prior art memory units include simple address generators which are able to generate only one address range or a series of address ranges within a fixed, given cycle.

In prior art applications such as, for example, for the processing of data streams in digital transmission networks of a synchronous digital hierarchy (SDH), in which so-called STM-N frames are transmitted that are structured according to CCITT Recommendations G.707 to G.709, it is necessary to configure memory units so that they are flexible. In an STM-N frame, the useful information to be transmitted is contained in one or several firmly defined virtual containers. A memory unit must be able to assign different addresses to the individual containers in an elastic memory. Since an STM-N frame can be structured in different ways, that is, it may be occupied by different possible combinations of virtual containers, e.g., VC-11, VC-21, VC-12 or VC-22, the address ranges in the elastic memory must be flexible in their definitions.

SUMMARY OF THE INVENTION

It is therefore an object of the present invention to provide a simple memory element which is able to temporarily generate a plurality of address ranges of different sizes as well as a variable number of address ranges.

This is accomplished by providing an address generator able to generate different address ranges based on start and end addresses in an associated address register and a code signal. Advantageous modifications of the invention will become apparent from the detailed description taken with the accompanying drawings.

BRIEF DESCRIPTION OF THE DRAWINGS

One embodiment of the invention will be described with reference to FIGS. 1 to 5, in which.

DETAILED DESCRIPTION OF THE PREFERRED EMBODIMENTS

Figure 1:
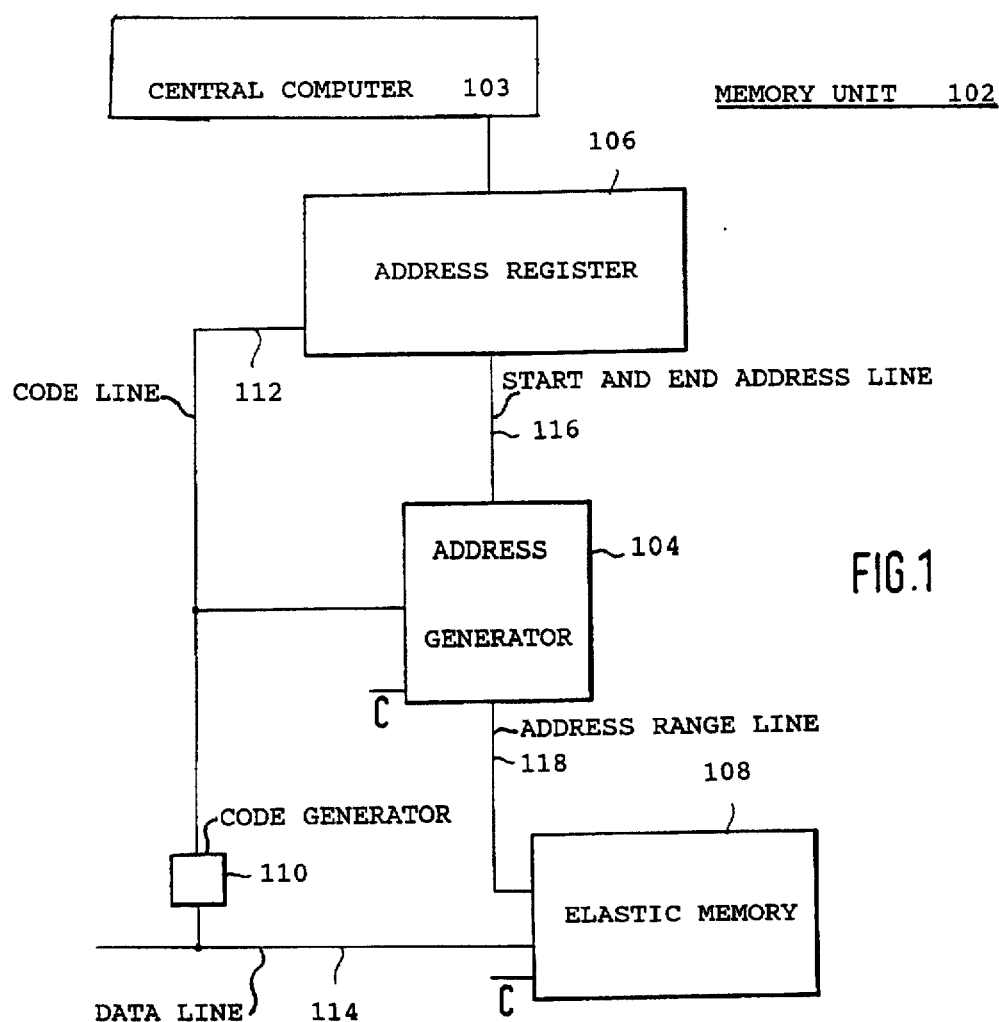
FIG. 1 is a block circuit diagram for a memory unit including the address generator according to the invention.

FIG. 1 depicts a block circuit diagram for an embodiment of a memory unit 102 equipped with an address generator 104 according to the invention. In the illustrated embodiment, address generator 104 is connected with a programmable address register 106, with an elastic memory 108 and with a code generator 110. Code generator 110 is also connected with address register 106. From the data stream that is to be intermediately stored in elastic memory 108, the code generator 110 generates codes, i.e., identifier numbers, for predetermined signal components or data blocks and these codes are reported to address register 106 and address generator 104 by way of a code line 112. For this purpose, code generator 110 is connected with a data line 114 that also leads to the elastic memory 108.

Memory unit 102 serves to intermediately store those signal components, i.e., signal portions, of an STM-N frame which form a transmission channel in elastic memory 108 each in a respective address range of elastic memory 108. For this purpose, code generator 110 informs address register 106 and address generator 104 by way of code line 112 which signal component is present at the respective moment at the data input of elastic memory 108. Each individual channel is thus assigned a code, i.e., identifier number. In order to be able to more easily illustrate the significant features of the invention, the delay elements required because of the differences in travel time will not be described.

Figure 2:
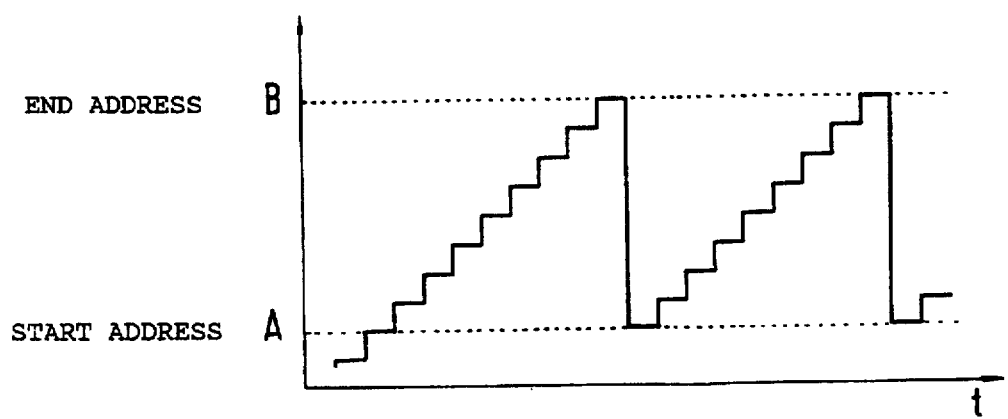
FIG. 2 depicts the addressing of the memory for one memory range plotted over time.

The start and end addresses of the individual channels are stored in address register 106. They are transmitted to address generator 104 by way of the start and end address line 116 as soon as an appropriate code, i.e., identifier number, is present at code line 112. Address generator 104 includes a counter which steps up the address value, as shown in FIG. 2, by the amount of one each time the same code is present again until the end address of the address range identified by this code is reached. In FIG. 2, the start address is marked A and the end address is marked B. Address register 106 feeds the end address for the respectively involved code to address generator 104. The end address is identified by a comparator. If the end address is present, the stored value is no longer increased but is reset to the starting value identified by the present code.

Since in an STM-N frame the signal components of the channels are transmitted with a cyclic offset, the codes likewise appear cyclically in code line 112. A RAM stores an address value for each code and this value is increased by the subsequent identical codes.

If the memory element is inscribed for the first time or if, for example, the number or occupation of the channels is changed, which also leads to a change in the address ranges, the codes are assigned to a first or new address range. A central computer 103 knows the initial occupation or re-occupation of the time slots in the STM-N frame and informs address register 106 which code should be assigned to which start and end address. If now a code is present for the first time in code line 112 or it is present with newly assigned start and end addresses, address generator 104 is informed by way of start and end address line 116 of the new start and end addresses. If the RAM is inscribed for the first time, the address generator 104 counts through the possible addresses, beginning at an arbitrary address, until it reaches the end address of an address range identified by the code. Then the RAM is set for the start address of the respective code; when this code is present again, the address generator 104 has reached the steady state for this code.

If during the transmission the channel occupation is changed, the corresponding start and end value, identified by the code, are present in start and end address line 116. The counter of address generator 104 counts through the address range until it reaches the newly applied end address. The fact that the end address is reached, causes a new start address to be set in the RAM for the respective code.

In the above-described manner, the address ranges can be controlled by way of the central computer 103 and can be changed centrally according to the channel occupation.

In the illustrated embodiment, the code or codes are derived from the data stream to be intermediately stored and an address range is generated from a code to be fed by the address generator via address range line 118 to the input for the write address of elastic memory 108.

A read address can be generated in the same manner. In that case, a computer unit generates the code simultaneously with an empty frame for the outgoing data stream.

The manner in which the code is generated is not part of the present invention; it is greatly dependent on the type of data stream. If the data stream represents an STM-N frame, the code detector receives its information about the type and the occupation of the channels from central computer unit 103.

Figure 3:
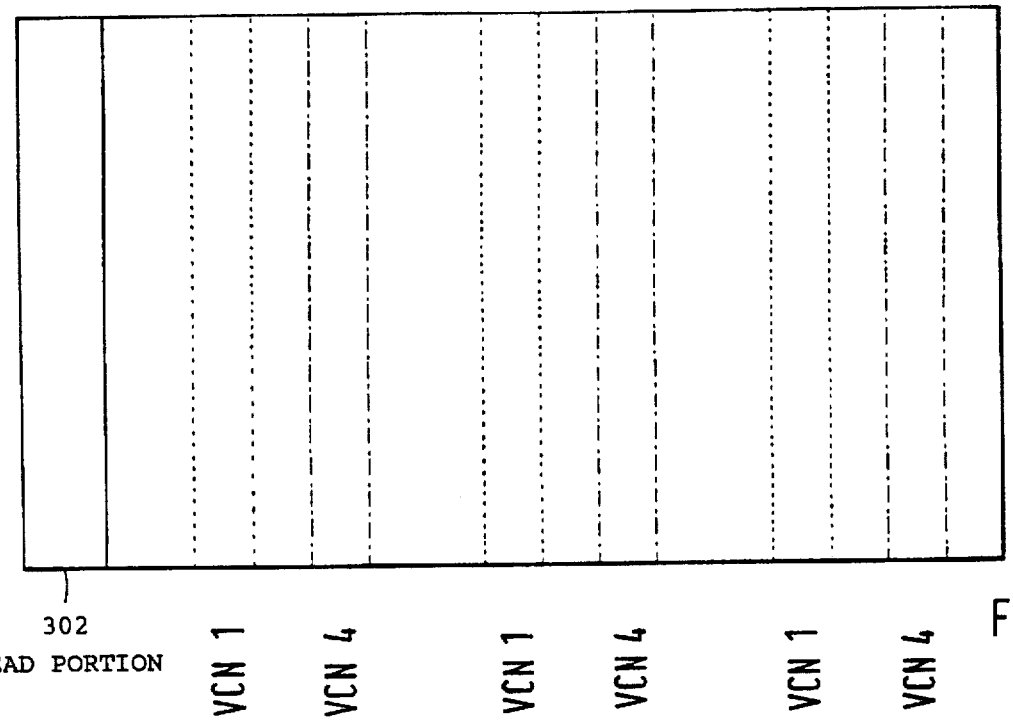
FIG. 3 depicts part of a frame in which the signal to be stored is transmitted.

FIG. 3 shows the useful range of an STM-1 frame in simplified form. The left column represents the head portion POH 302 of the useful component. Such a useful component is known to be composed of 8-bit words that are arranged in 261 columns and 9 rows. Virtual containers VC are available in the STM-1 frame for the construction of channels. FIG. 3 shows, as an example, two virtual containers VCN1 and VCN4 that are arranged equidistantly within the frame. The numerals 1 and 4 represent the codes for these virtual containers. For the case where the virtual containers are virtual containers VC-12, the useful range includes a maximum of 63 virtual containers. Each one of these virtual containers, if it is occupied, is given a code, so that a maximum of 63 codes are present.

If a virtual container VC-4 is present, the elements of this container are identified by only one code. If a mixture of different virtual containers is present, for example, a mixture composed of VC-11, VC-12, VC-21, VC-22, VC-31 and VC-32, or a mixture permitted by the CCITT Recommendations, the possible number of virtual containers lies between 3 and 63. Since the position and combination of virtual containers can be selected in many ways and each virtual container is assigned an address range within the elastic memory 108, address generator 104 must be able to generate a different number of address ranges, possibly of different sizes, within the elastic memory 108.

Fill bytes disposed in the virtual containers are known to the code generator 110 or the computer unit 103. Fill bytes are not given a code so that only the information itself can be intermediately stored in the elastic memory 108.

Figure 5:
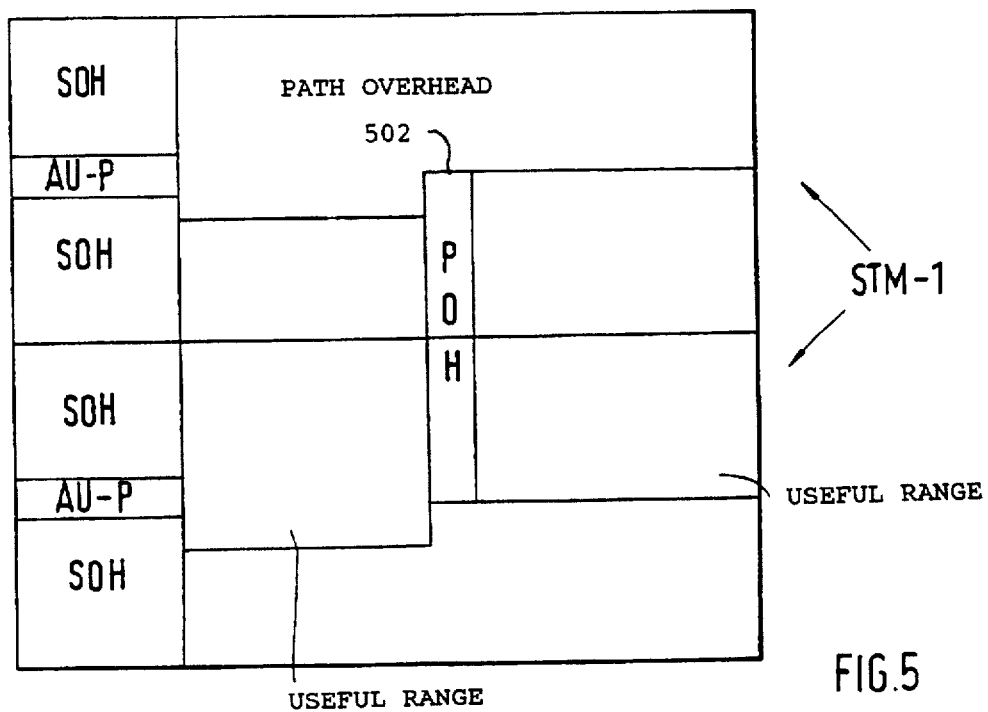
FIG. 5 depicts a possible way to structure an STM-N frame.

An advantageous arrangement and configuration of a memory unit 102' will now be described with reference to FIG. 4. In the illustrated embodiment, memory unit 102' serves the purpose of converting an incoming STM-1 frame into a different, outgoing STM-1 frame. In an STM-1 frame, the useful range is composed, as shown in FIG. 5, of a component called path overhead POH 502 and a region to which the virtual containers are assigned. According to the CCITT recommendations, it is here not necessary for the path overhead component to be located in the first column of the useful range, instead it may be disposed anywhere within the useful range. The result is that a row of a useful range contained in an STM-1 frame is distributed, as shown in FIG. 5, to two rows of the STM-1 frame. In an STM-1 frame, the useful range is shifted in such a way within the frame that a row of a useful range is also always disposed in a row of the frame. This arrangement permits a simpler, subsequent processing of the useful range, for example, in a so-called cross connect.

Figure 4:
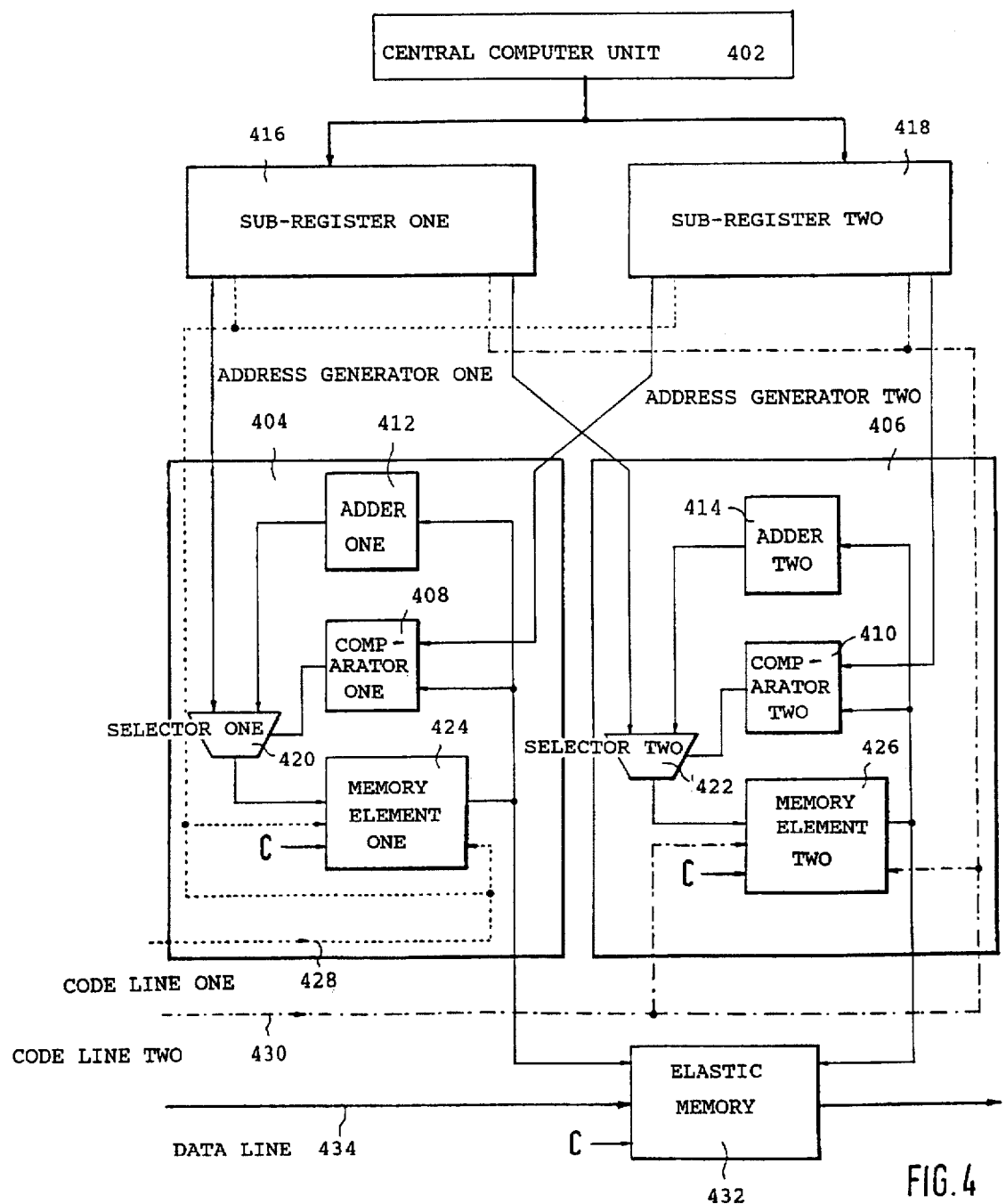
FIG. 4 depicts a memory unit according to the invention for the intermediate storage of the useful portion of an STM-N frame.

The STM-1 frame is converted into an STM-1** frame by means of the memory unit 102' shown in FIG. 4. Memory unit 102' according to FIG. 4 differs from memory unit 102 of FIG. 1 in that the devices for addressing the read address and the address generators 404, 406 are given in detail and address registers 416, 418 are organized in a different manner.

The write address of elastic memory 432 is generated in an address generator 404 and the read address in an address generator 406. Address generators 404 and 406 are of identical construction and each include a memory element 424, 426 which is connected with the write input or the write output of elastic memory 432 and, within the respective address generator 404, 406, with a comparator 408, 410, and one input of an adder 412, 414. Address register 106 is divided into two sub-registers 416, 418, each of which is laid out in a dual configuration. The start addresses for each address range are disposed in one sub-register and the end addresses for each address range are disposed in the other sub-register. Due to the dual configuration of the address register components, address generator 404 as well as address generator 406 are able to simultaneously access sub-registers 416, 418 of address register 106.

The output of adder 412 and an output of sub-register 416 of the address register in which the start addresses are present are connected with the inputs of a selector 420 disposed within address generator 404, with it being possible, by way of a control line connected with the output of comparator 408, to energize one of the two inputs. The output of selector 420 is connected with the data input of memory element 424. The second input of comparator 408 is connected with sub-register 418 of address register 106. The write and read output of memory element 424 and the two sub-registers 416 and 418 of the address register are connected with a code line 428. The operating sequence of the memory unit has already been described in principle in connection with FIG. 1. In the embodiment of FIG. 5, the operating sequence is the following:

A code is simultaneously present at the read and write inputs of memory element 424 and at the read inputs of address sub-registers 416 and 418. This causes a start address as identified by the code from address sub-register 416 to be fed to an input of selector 420 and the associated end address from address sub-register 418 to be fed to an input of comparator 408. At the same time, a memory location given by the code is addressed in memory element 424. The address value is fed to the write input of the elastic memory 432, an input of comparator 408 and the input of adder 412. In the steady state, that is, once a channel has already been energized, this address value constitutes the current write address in elastic memory 432 for a certain code. If a channel is just being established, this is known to the transmission system by way of central computer 402 and the already stored data are not yet utilized. Comparator 408 determines whether the present address value coincides with the end address. In adder 412, the address value is increased by one and the increased value is fed to an input of selector 420. If two different values are present at comparator 408, the latter energizes the input of selector 420 that is connected with adder 412 and overwrites in memory element 424 the preceding value for this code with the address value as increased in adder 412.

If two identical values are present at comparator 408, this means that during writing into elastic memory 432 the end address of an address range has been reached. In that case, the input of selector 420 connected with address sub-register 416 is energized so that the currently stored address value, the end address, is overwritten by the start address.

Address generator 406 has the same configuration as address generator 404 and operates in the same manner. The only difference is that, in order to generate the read addresses, it is connected with the read input of elastic memory 432 and is supplied from another code generator via another code line 430.

In the illustrated embodiment, the start and end addresses for a certain code are the same for the write as well as the read address. The difference in the addresses in this case lies in the sequence of the generated codes.

For memory unit 102' only those elements 416, 418, 412, 414, 408, 410, 420, 422, 424, 426, 432 are selected which can be arranged in the so-called integrated gate array technology. So-called macro cells are employed as the elastic memory 432; they are offered as functional units by the manufacturers of gate arrays, with their length and depth being freely selectable.

It will be understood that the above description of the present invention is susceptible to various modifications, changes and adaptations, and the same are intended to be comprehended within the meaning and range of equivalents of the appended claims.

What is claimed is:

1. A memory unit for intermediately storing data blocks of a data stream, the data stream including a plurality of transmission channels, comprising:

an elastic memory with which data can be simultaneously read in and read out;

at least one address register; and an address generator for successive generation of respective address ranges associated with the transmission channels, each of the address ranges having a respective size, each address range being delimited by a start address and an end address, at least parts of the data stream being thereby successively written into and read out of the elastic memory, wherein:

the address generator generates different address ranges for respective different ones of the plurality of transmission channels and is connected with the at least one address register from which it receives associated start and end addresses of the address ranges;

the address generator is connected with write and read inputs of the elastic memory;

the at least one address register and the address generator are supplied with external identifier numbers which are derived from the data stream, each identifier number being associated with a respective one of the plurality of transmission channels and indicating the block length of a data block which is to be stored;

in response to being supplied with one of the identifier numbers, the start address and the end address in the at least one address register of an address range associated with said one of the identifier numbers are output to said address generator, the start address and the end address being employed for addressing said elastic memory;

the address generator includes means for counting cyclically through the address ranges from the start address of each address range to the end address of each address range, the address ranges that are generated by the address register varying in size as a function of the identifier number; and the address generator includes means for resetting a memory location for an address range to an associated start address when the end address of the address range is reached.

2. A memory unit according to claim 1, wherein:

the address generator includes a memory element, a comparator having an output, an adder having an output, and a selector, a data output of the memory element constituting an output of the address generator, the data output being connected with a first input of the comparator and with an input of the adder;

the end address of an address range identified by the identifier number is present at a second input of the comparator;

one of:

the output of the at least one address register at which the start address is present, and the output of the adder, is selectively connected by way of the selector with a data input of the memory element, a switching state of the selector being controlled by way of the output of the comparator, the selector providing to the memory element the output of the at least one address register at which the start address is present if identical input signals are present at the comparator; and the identifier number is present at address inputs of the memory element.

3. A memory unit according to claim 2, wherein the address generator successively forms addresses of a plurality of channels which are contained in different virtual containers.

4. A memory unit according to claim 1, wherein two address generators are provided and wherein a first address generator is connected with a write input of the elastic memory while a second address generator is connected with a read input of the elastic memory.

5. A memory unit according to claim 1, wherein the address ranges that are generated by the address register additionally vary in number as a function of the identification number.

6. A memory unit according to claim 1, wherein the identifier numbers are transmitted within the data stream.

7. A memory unit for use with a computer to store data blocks of a data stream, the data stream including a plurality of transmission channels, said memory unit comprising:

a memory which receives the data stream;

code generator means for deriving identifier numbers from the data stream, each identifier number being associated with a respective one of the transmission channels and indicating the block length of a data block which is to be stored;

address register means for storing start and end addresses of address ranges and for emitting a particular start address and a particular end address in response to a particular identifier number from the code generator means, the start and end addresses being changeably assigned by the computer, the address ranges varying in size as a function of the identifier number; and address generator means for addressing the memory, while at least part of the data stream is stored therein, by counting through an address range from a start address emitted by the address register means to an end address emitted by the address register means.

8. A memory unit according to claim 7, wherein the memory is an elastic memory which can simultaneously have data stored and read out.

9. A memory unit according to claim 7, wherein the address generator means comprises a comparator which compares the end address emitted by the address register means with a count value.

10. A memory unit according to claim 7, wherein the address generator means comprises a memory element having a data output, a comparator having an input which is connected to the data output of the memory element, an adder having an input which is connected to the data output of the memory element, and a selector which is connected to the address register means and to the adder, comparator, and memory element.

11. A memory unit according to claim 7, wherein the address ranges additionally vary in number as a function of the identifier number.

12. A memory unit according to claim 7, wherein the identifier numbers are transmitted within the data stream.

* * * * *